(12) United States Patent
Zaderej et al.

(10) Patent No.: US 12,176,659 B2
(45) Date of Patent: Dec. 24, 2024

(54) SMART CONNECTOR AND METHOD OF MANUFACTURING SAME USING AN APPLICATION SPECIFIC ELECTRONICS PACKAGING MANUFACTURING PROCESS

(71) Applicant: Molex, LLC, Lisle, IL (US)

(72) Inventors: Victor Zaderej, Wheaton, IL (US); Alan Han, Chicago, IL (US); Richard Fitzpatrick, Chicago, IL (US)

(73) Assignee: Molex, LLC, Lisle, IL (US)

( * ) Notice: Subject to any disclaimer, the term of this patent is extended or adjusted under 35 U.S.C. 154(b) by 617 days.

(21) Appl. No.: 17/414,352

(22) PCT Filed: Jan. 22, 2020

(86) PCT No.: PCT/US2020/014494
§ 371 (c)(1),
(2) Date: Jun. 16, 2021

(87) PCT Pub. No.: WO2020/154336
PCT Pub. Date: Jul. 30, 2020

(65) Prior Publication Data
US 2022/0059977 A1 Feb. 24, 2022

Related U.S. Application Data

(60) Provisional application No. 62/795,299, filed on Jan. 22, 2019.

(51) Int. Cl.
*H01R 13/66* (2006.01)
*H01R 13/52* (2006.01)
(Continued)

(52) U.S. Cl.
CPC ......... *H01R 13/665* (2013.01); *H01R 43/205* (2013.01); *H01R 43/24* (2013.01);
(Continued)

(58) Field of Classification Search
CPC .... H01R 13/665; H01R 43/205; H01R 43/24; H01R 13/5202; H01R 13/6658;
(Continued)

(56) References Cited

U.S. PATENT DOCUMENTS

| 6,779,260 B1 | 8/2004 | Brandenburg et al. |
| 2003/0227764 A1 | 12/2003 | Korczynski |

(Continued)

FOREIGN PATENT DOCUMENTS

| CN | 102270799 A | 12/2011 |
| CN | 205746638 U | * 11/2016 ............ F21V 17/101 |

(Continued)

OTHER PUBLICATIONS

Office action received for JP Application No. 2021-531243, mailed on May 17, 2022, 13 pages (7 pages of English translation and 6 pages of Official copy).

(Continued)

*Primary Examiner* — Michael C Zarroli

(57) ABSTRACT

In an embodiment, a smart connector includes an Application Specific Electronics Packaging device formed by an Application Specific Electronic Packaging manufacturing process, and a separate printed circuit board electrically connected to electrical components of the Application Specific Electronic Packaging device. The Application Specific Electronic Packaging manufacturing process includes forming a continuous carrier web having a plurality of lead frames, overmolding a substrate onto the fingers of each lead frame, each substrate having a plurality of openings which exposes a portion of the fingers, electroplating the traces, and electrically attaching at least one electrical component to the traces to form a plurality of Application Specific Electronic Packaging devices. In some embodiments, the printed circuit board has electrical components configured to (Continued)

control the functionality of the electrical components. In some embodiments, the printed circuit board has electrical components configured to modify properties of the smart connector.

2 Claims, 8 Drawing Sheets

(51) Int. Cl.
  *H01R 43/20* (2006.01)
  *H01R 43/24* (2006.01)
  *H05K 1/14* (2006.01)
  *H05K 1/18* (2006.01)
  *H05K 3/00* (2006.01)
  *H05K 3/34* (2006.01)
  *H05K 3/36* (2006.01)

(52) U.S. Cl.
  CPC .............. *H05K 1/144* (2013.01); *H05K 1/18* (2013.01); *H05K 3/007* (2013.01); *H05K 3/341* (2013.01); *H05K 3/368* (2013.01); H01R 13/5202 (2013.01); H05K 3/0014 (2013.01); H05K 2201/09118 (2013.01); H05K 2201/10151 (2013.01); H05K 2201/10166 (2013.01)

(58) Field of Classification Search
  CPC .... H01R 43/16; H01R 24/60; H01R 2107/00; H05K 1/144; H05K 1/18; H05K 3/007; H05K 3/341; H05K 3/368; H05K 3/0014; H05K 2201/09118; H05K 2201/10151; H05K 2201/10166; H05K 2201/041; H05K 1/0263; H05K 2203/1545; H05K 3/24; H05K 3/202
  See application file for complete search history.

(56) References Cited

U.S. PATENT DOCUMENTS

| | | | |
|---|---|---|---|
| 2018/0184526 A1* | 6/2018 | Spiegel | H05K 1/092 |
| 2019/0356089 A1* | 11/2019 | Costello | H01R 12/724 |
| 2022/0354014 A1* | 11/2022 | Feurtado | H05K 1/0271 |

FOREIGN PATENT DOCUMENTS

| | | |
|---|---|---|
| EP | 0929123 A1 | 7/1999 |
| JP | 2006121861 A | 5/2006 |
| JP | 2013026627 A | 2/2013 |
| JP | 2013030291 A | 2/2013 |
| JP | 2014007345 A | 1/2014 |
| JP | 2016005384 A | 1/2016 |
| JP | 2017163135 A | 9/2017 |
| JP | 2018098008 A | 6/2018 |
| WO | 2007026945 A1 | 3/2007 |
| WO | 2014141346 A1 | 9/2014 |
| WO | 2017004064 A1 | 1/2017 |
| WO | 2018009554 A1 | 1/2018 |
| WO | 2020154336 A1 | 7/2020 |

OTHER PUBLICATIONS

Extended European Search Report received for the EP Application No. 20745683.1, mailed on Sep. 26, 2022, 8 pages.

Zaderej Victor et al., "ASEP (Application Specific Electronics Package) A Next Generation Electronics Manufacturing Technology", Proceedings of SMTA International, Retrieved from Internet URL: https://www.circuitinsight.com/pdf/asep_next_generation_electronics_manufacturing_technology_smta.pdf, Oct. 14, 2018, 7 pages.

International Search Report and Written Opinion received for PCT Application No. PCT/US2020/014494, mailed on May 25, 2020, 9 pages.

* cited by examiner

SMART CONNECTOR AND METHOD OF MANUFACTURING SAME USING AN APPLICATION SPECIFIC ELECTRONICS PACKAGING MANUFACTURING PROCESS

RELATED APPLICATION

This application is a National Phase of International Application No. PCT/US2020/014494 filed on Jan. 22, 2020, which claims priority to U.S. Provisional Application No. 62/795,299, filed Jan. 22, 2019, the contents of which are incorporated herein by reference in their entireties.

TECHNICAL FIELD

This disclosure relates to a smart connector, and the method of manufacturing thereof. More specifically, this disclosure relates to a smart connector and the method of manufacturing thereof, which partially uses an Application Specific Electronics Packaging manufacturing process to form the smart connector.

DESCRIPTION OF RELATED ART

Application Specific Electronic Packaging devices and manufacturing process have been developed by the Applicant and are useful for the creation of electronics modules that integrate the function of printed circuit boards, heat sinks, connectors, high current conductors, and thermal management features into a single electronics module. An advantage of the Application Specific Electronics Packaging manufacturing process is that it allows a manufacturer to integrate connector functions into the electronics module that would be much larger and more expensive if the connector functions were discrete components. Furthermore, metal contacts integrated into Application Specific Electronics Packaging devices are highly conductive so the metal contacts provide an optimal path for carrying high current, as well as removing heat very efficiently.

The Application Specific Electronics Packaging manufacturing process utilizes many of the same manufacturing steps used to produce connectors, but adds significantly more functionality with minimal addition of cost. Application Specific Electronics Packaging manufacturing processes have previously been described and illustrated in International Application No. PCT/US2016/039860, filed on Jun. 28, 2016 and published as International Publication No. WO 2017/004064 on Jan. 5, 2017, and in International Application No. PCT/US2017/040736, filed on Jul. 5, 2017 and published as International Publication No. WO 2018/009554 on Jan. 11, 2018, the disclosures of which are incorporated herein by reference.

One of the industries that Application Specific Electronics Packaging devices and Application Specific Electronics Packaging manufacturing processes has been found to be able to provide significant value for is that of power electronics. Due to the increasing demand for electrification and higher power levels in a variety of industries, the need for better ways to produce high power electronics is exponentially growing.

Today, power electronics are still assembled onto "thick Cu PCBs" that may have 3 to 5-ounce Cu traces (110 to 185 microns thick). But not only are these types of PCBs expensive, they are not actually very good at carrying the very high currents (100 to 500 Amps) that are required by the industry. Techniques such as using heat pipes are being considered in order to help remove the heat being generated, but these approaches are often bulky and expensive to implement.

Application Specific Electronics Packaging manufacturing processes for forming power electronics enable designers with an approach to dramatically reduce the electrical resistance in the system, thereby reducing the amount of heat generated. Furthermore, by directly attaching the power devices that generate some of the heat to a highly thermally conductive metal, Application Specific Electronics Packaging devices enable the removal of the heat that is still generated in a much more efficient way.

While Application Specific Electronics Packaging manufacturing devices and processes provide some significant advantage in the design and manufacture of power electronics where currents of several hundred amps would be possible, one of the challenges associated with changing the features and or performance requirements of an Application Specific Electronics Packaging device is that different applications may require entirely new stamping dies and or molds. This could result in difficulty justifying the cost associated with the new stamping dies and or molds and the time associated with manufacturing and qualifying the stamping dies and or molds.

Thus, there is a need for an improved Application Specific Electronics Packaging device and an improved process of manufacturing same.

SUMMARY

In an embodiment, a smart connector includes an Application Specific Electronics Packaging (ASEP) device formed by an Application Specific Electronics Packaging manufacturing process, and a separate printed circuit board electrically connected to electrical components of the Application Specific Electronics Packaging device. The Application Specific Electronics Packaging manufacturing process includes forming a continuous carrier web having a plurality of lead frames, overmolding a substrate onto the fingers of each lead frame, each substrate having a plurality of openings which exposes a portion of the fingers, electroplating the traces, and electrically attaching at least one electrical component to the traces to form a plurality of Application Specific Electronics Packaging devices. In some embodiments, the printed circuit board has electrical components configured to control the functionality of the electrical components. In some embodiments, the printed circuit board has electrical components configured to modify properties of the smart connector.

In an embodiment, a method of forming a smart connector includes: forming a continuous carrier web having a plurality of lead frames, each lead frame defining an opening and having a plurality of fingers which extend into the opening; overmolding a substrate onto the fingers of each lead frame, each substrate having a plurality of openings provided therethrough which exposes a portion of the fingers to form exposed portions; electrically connecting an electrical component to the exposed portion of some of the fingers of each lead frame to form a plurality of devices, each device having at least one electrical component; and electrically attaching a printed circuit board to the exposed portion of some of the fingers of one of the devices, the printed circuit board having electrical components configured to control the functionality of the at least one electrical component of the one device.

BRIEF DESCRIPTION OF THE DRAWINGS

The present application is illustrated by way of example and not limited in the accompanying figures in which like reference numerals indicate similar elements and in which.

DETAILED DESCRIPTION

The detailed description that follows describes exemplary embodiments and the features disclosed are not intended to be limited to the expressly disclosed combination(s). Therefore, unless otherwise noted, features disclosed herein may be combined together to form additional combinations that were not otherwise shown for purposes of brevity. The terms "forward" and "rearward" are used for description purposes only and do not denote a required orientation during use.

Figure 9:
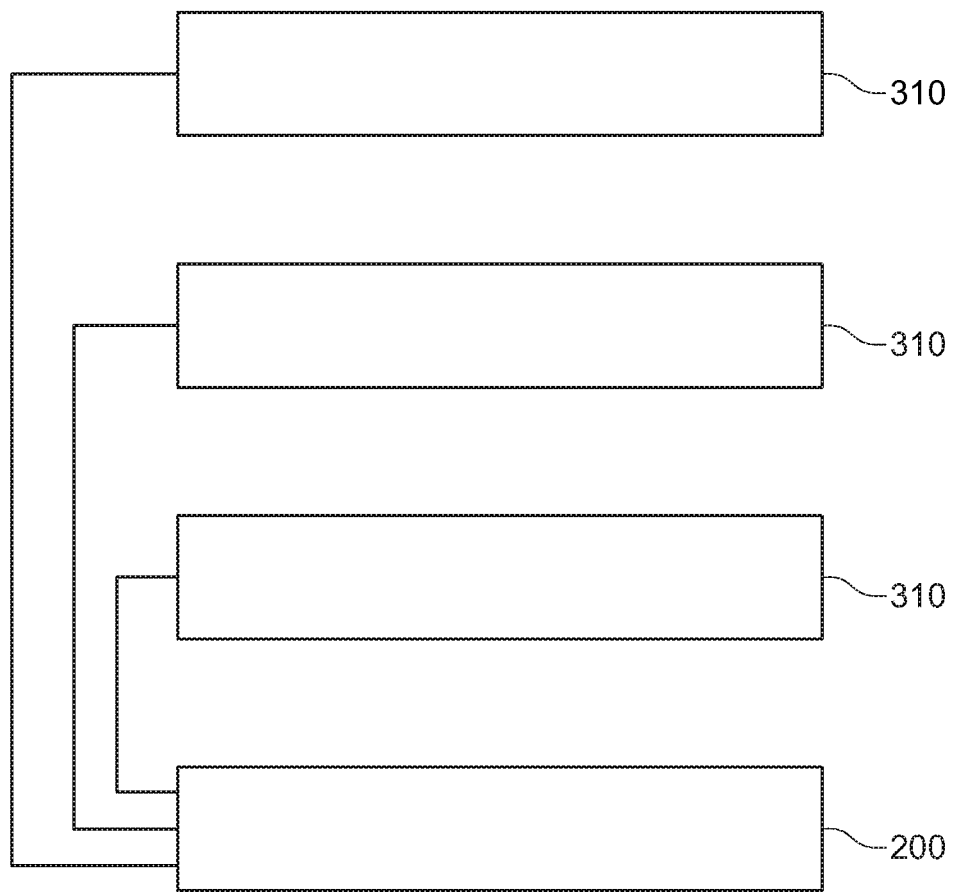
FIG. 9 depicts a schematic view of multiple Application Specific Electronics Packaging devices connected to a single printed circuit board.

The present disclosure is directed to improvements in the design and manufacture of a smart connector 360 which is partially formed using an Application Specific Electronics Packaging manufacturing process 320. In some embodiments, the smart connector 360 includes an Application Specific Electronics Packaging device 310 which is formed using the Application Specific Electronics Packaging manufacturing process 320 and a separate printed circuit board 200 which is attached to the Application Specific Electronics Packaging device 310 to control the operation of the Application Specific Electronics Packaging device 310 in different manners. In some embodiments, the smart connector 360 includes an Application Specific Electronics Packaging device 310 which is formed using the Application Specific Electronics Packaging manufacturing process 320 and a separate printed circuit board 200 which is attached to the Application Specific Electronics Packaging device 310 to modify properties of the resulting smart connector 360 in different manners. In an embodiment, the Application Specific Electronics Packaging device 310 and the printed circuit board 200 are assembled/connected into a housing 375 to form the smart connector 360. In some embodiments, multiple Application Specific Electronics Packaging devices 310 are connected to the printed circuit board 200 and the printed circuit board 200 interacts with all of the Application Specific Electronics Packaging devices 310, as shown schematically in FIG. 9.

The Application Specific Electronics Packaging device 310 includes base electrical components 386 which are commonly used in a variety of applications to meet customer's needs. The base electrical components 386 may include, but are not limited to, microprocessor unit (MPU)/micro controller unit (MCU), field-programmable gate array (FPGA), field-effect transistor (FET) which may have an associated gate driver, insulated-gate bipolar transistor (IGBT), motor driver, electronic components for implementing communication frontend (such as a RJ45 connector), sensors (such as current sensors), diodes, capacitors, and resistors. The current sensor may be used to monitor the FET. Application Specific Electronics Packaging manufacturing processes 320 provides several significant advantages for the design and manufacture of high-power electronics—an industry that will be growing exponentially over the next decade due to the electrification of the transportation and other industries. Because of the benefits provided by the Application Specific Electronics Packaging device 310 manufactured by the Application Specific Electronics Packaging manufacturing process 320, the FET may be a 40-amp or more field effect transistor.

The separate printed circuit board 200 includes electrical components 202 which characteristics/parameters can be varied and which interact with the base electrical components 386 on the Application Specific Electronics Packaging device 310. The electrical components 202 on the separate printed circuit board 200 may include, but are not limited to, microprocessor unit (MPU)/micro controller unit (MCU)/central processing unit (CPU), electronic components for implementing communication protocols, memory, field-programmable gate array (FPGA). Examples of communication protocols include Controller Area Network (CAN), Local Interconnect Network (LIN), FlexRay, ControlNet, DirectNet, Modbus, Profibus, any two wire or radio frequency (RF) communication protocol. Previously, these electrical components 202 which are provided on the separate printed circuit board 200 were integrated in the Application Specific Electronics Packaging device.

With the present disclosure, since certain features previously provided on prior art Application Specific Electronics Packaging devices are now provided on the separate printed circuit board 200, and not on the Application Specific Electronics Packaging device 310, many of the electronics and components for the smart connector 360 can be easily changed or upgraded by replacing the separate printed circuit board 200 by the manufacturer without having to retool for manufacturing the more costly Application Specific Electronics Packaging device 310. This allows the same Application Specific Electronics Packaging device 310 to be used with multiple printed circuit boards 200, thereby allowing the manufacturer to cost effectively accommodate the same customer's requirements or multiple customers' requirements using the same base Application Specific Electronics Packaging device 310 and only changing the printed circuit board 200. The printed circuit board 200 is not optimal for use in routing high current and does not have good thermal management properties, however, the printed circuit board 200 provides the smart connector 360 with the advantages of high-density circuitry, multi-layering, and can be very quickly and cost effectively manufactured. As a result, the capital required to produce the base Application Specific Electronics Packaging device 310 can be left unchanged and minimal capital is only required to manufacture new printed circuit boards 200 for use with the same Application Specific Electronics Packaging device 310. This also solves the thermal challenges associated with applications because the Application Specific Electronics Packaging device 310 solves thermal challenges (which the printed circuit board 200 does not), while allowing for the application to be customized for each customer by changing the printed circuit board 200, thereby dramatically reducing the required capital to tool and manufacture high power applications.

Some examples of applications using these electrical components 202, 386 include the following. 1) A solid-state switch in which the printed circuit board 200 is a master. In the solid-state switch application, the printed circuit board 200 includes the MCU and the communication protocols (for example CAN, LIN), and the Application Specific Electronics Packaging device 310 includes the FET. 2) A compute module in which the printed circuit board 200 is a slave. In the compute module application, the printed circuit board 200 includes memory, and the Application Specific Electronics Packaging device 310 includes the CPU. 3) A communication module in which the printed circuit board 200 is a master. In the communication module application, printed circuit board 200 includes the MCU and the communication protocol, and the Application Specific Electronics Packaging device 310 includes the communication frontend (RJ45 connector). 4) A motor module in which the printed circuit board 200 is a master. In the motor module application, printed circuit board 200 includes the MCU and the communication protocol, and the Application Specific Electronics Packaging device 310 includes the motor driver.

As an example of how the printed circuit board 200 controls the operation of the Application Specific Electronics Packaging device 310, if the printed circuit board 200 includes the MCU and the communication protocol, and the Application Specific Electronics Packaging device 310 includes the FET, the MCU on the printed circuit board 200 instructs the FET on the Application Specific Electronics Packaging device 310 to turn on or off, as required. As an example, depending upon communication protocol provided on the printed circuit board 200, the operation of the Application Specific Electronics Packaging device 310 is controlled differently while using the same FET on the Application Specific Electronics Packaging device 310.

As an example of how the printed circuit board 200 modifies the properties of the resulting smart connector 360, if the printed circuit board 200 includes memory, and the Application Specific Electronics Packaging device 310 includes the CPU, depending upon the code stored in the memory is provided on the printed circuit board 200 alters the properties of the resulting smart connector 360.

Figure 1:
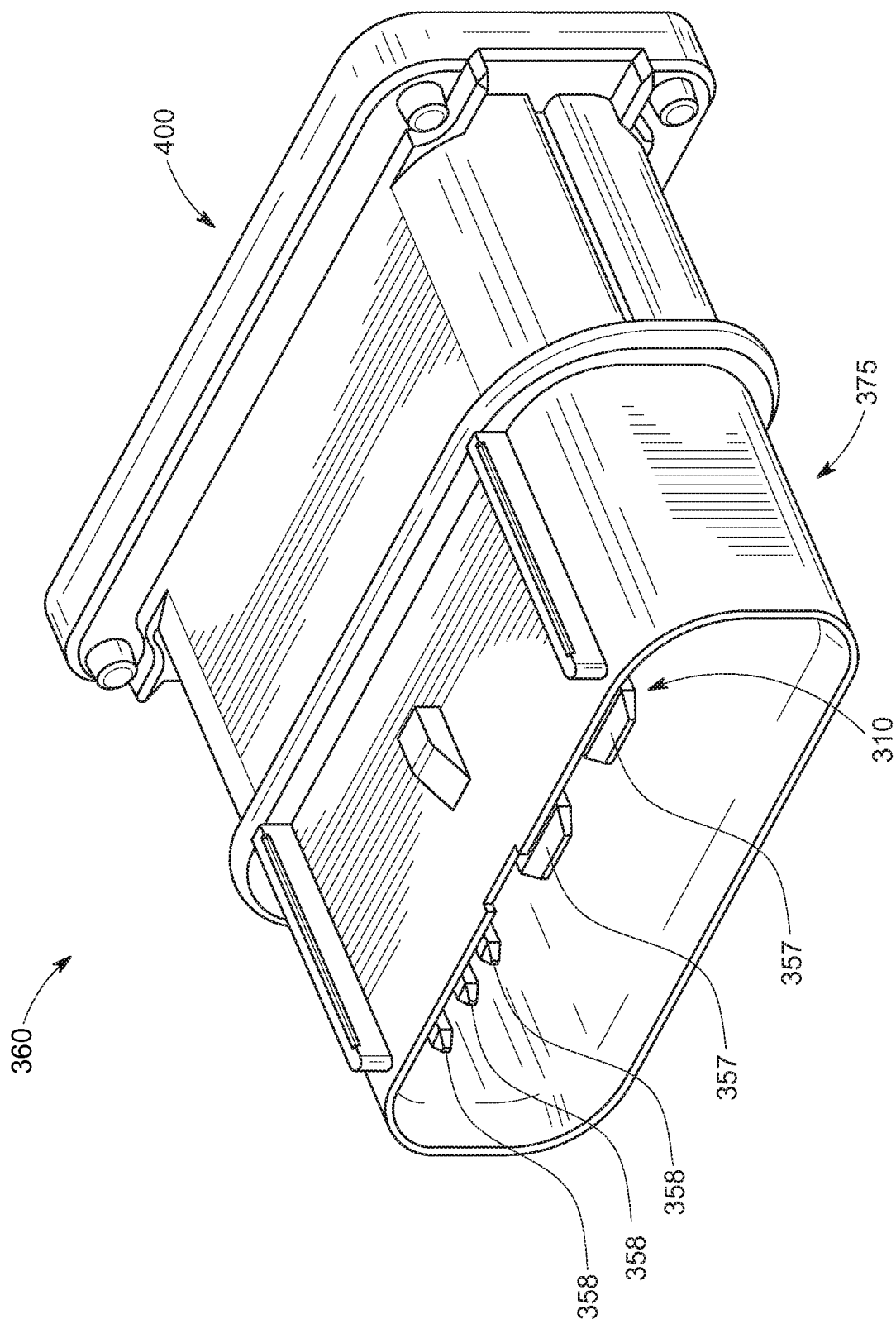
FIG. 1 depicts a perspective view of a smart connector.
Figure 2:
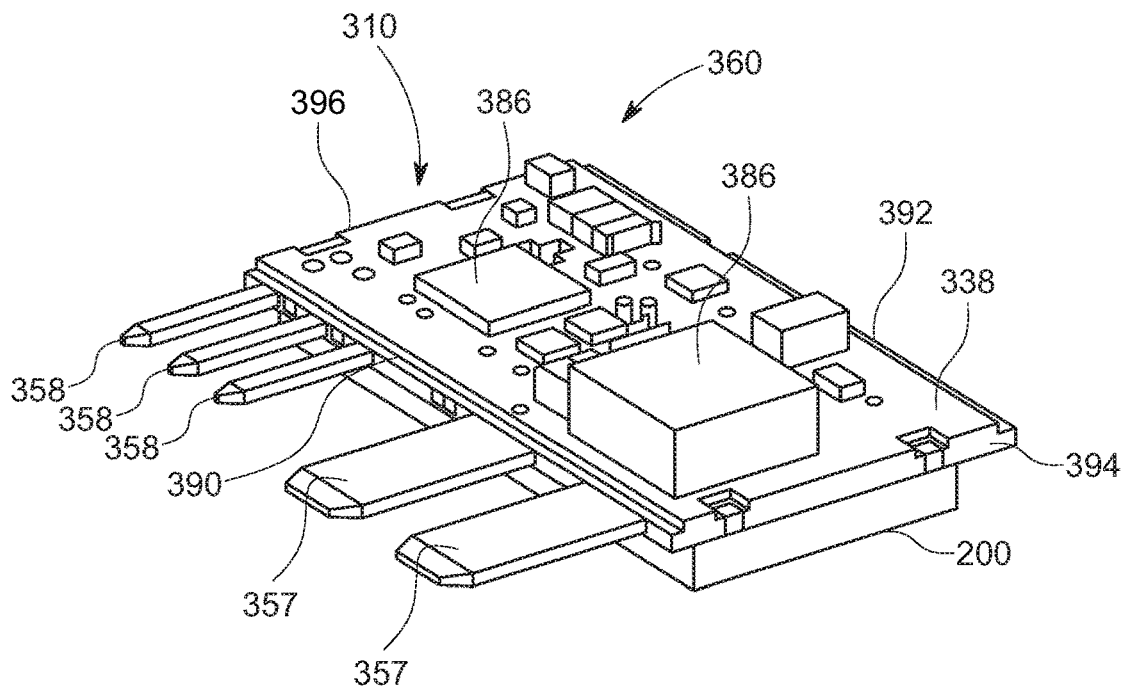
FIGS. 2 and 3 depict perspective views of an embodiment of an Application Specific Electronics Packaging device mated with a printed circuit board which forms part of the smart connector.
Figure 3:
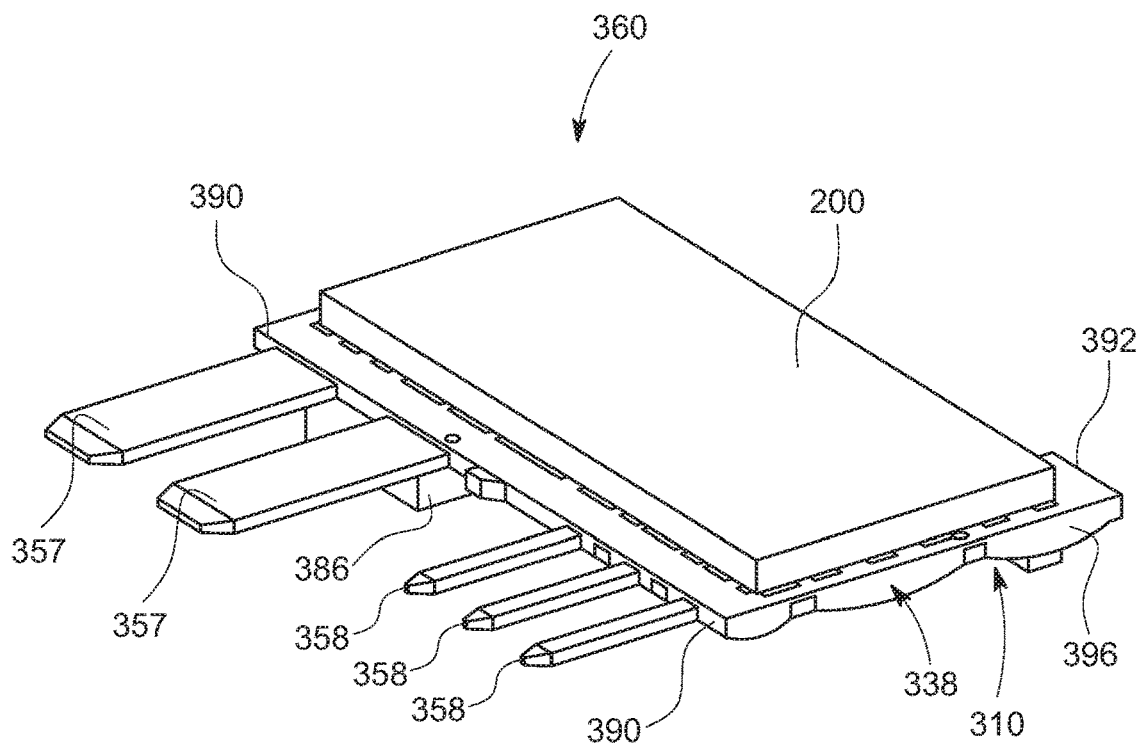
Figure 4:
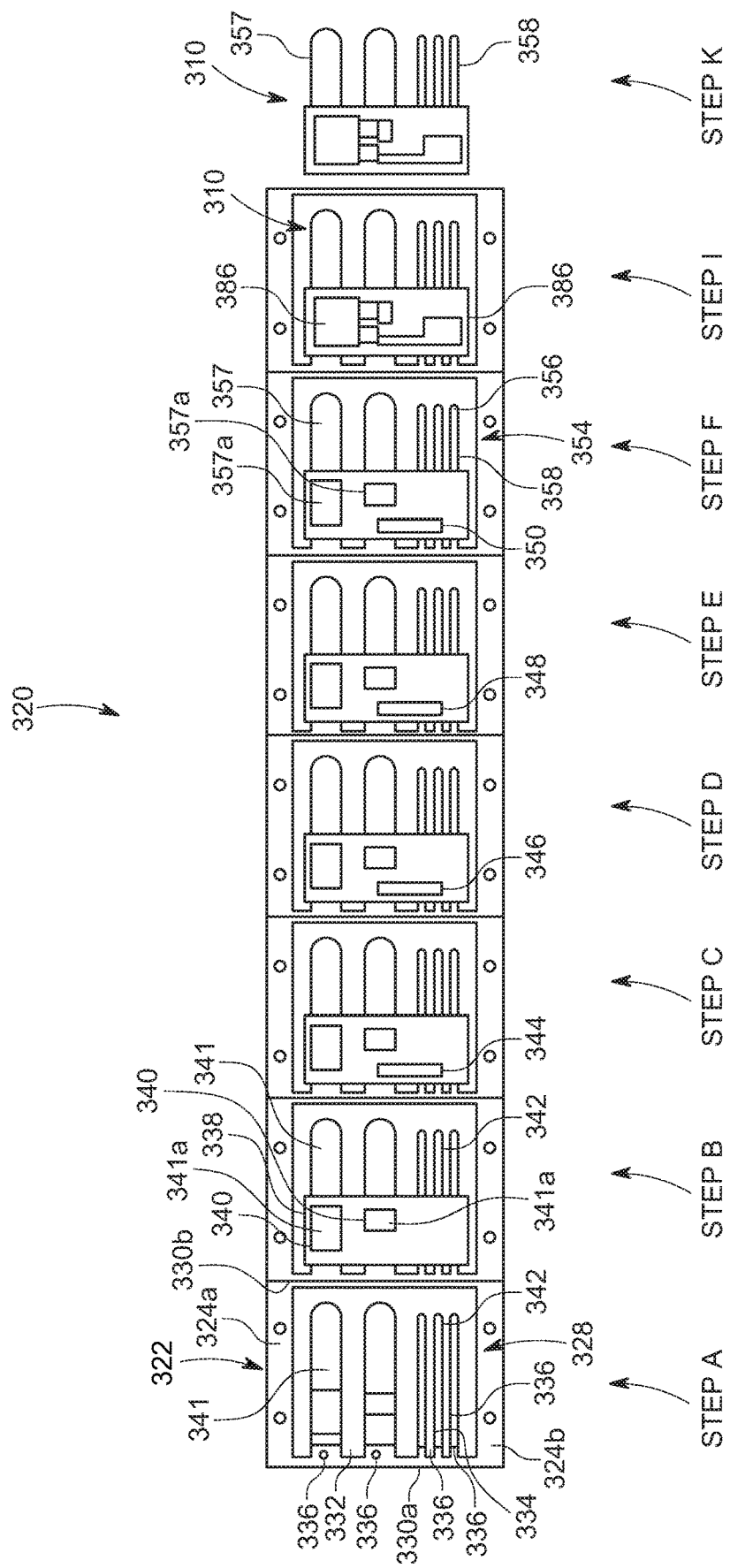
FIGS. 4 and 5 depict illustrations of the steps used to form Application Specific Electronics Packaging devices on a carrier at various stages of manufacture.

The smart connector 360 is partially formed using the Application Specific Electronics Packaging manufacturing process 320 as is known in the prior art, but the Application Specific Electronics Packaging manufacturing process 320 has been modified to form the smart connector 360 by accommodating electrical connection to the printed circuit board 200. Attention is directed to FIG. 4 which illustrates the formation of an Application Specific Electronics Packaging device 310 using the modified Application Specific Electronics Packaging manufacturing process 320, where the formed Application Specific Electronics Packaging device 310 is then used as part of the smart connector 360.

As illustrated in FIG. 4, the Application Specific Electronics Packaging manufacturing process 320 begins with Step A. Application Specific Electronics Packaging manufacturing process 320 preferably occurs between a pair of reels (not shown). In Step A, the middle portion of the carrier web 322 is stamped (thus removing undesired portions of the middle portion of the carrier web 322) to form a lead frame 328. The lead frame 328 is formed in a desired configuration suited for the formation of the Application Specific Electronics Packaging device 310. The lead frame 328 preferably includes the end portions 324a, 324b (it being understood that the end portions 324a, 324b of one lead frame 328 are continuous with the end portions 324a, 324b of the adjacent lead frame 328), a pair of stabilizing portions 330a, 330b (it being understood that stabilizing portion 330a of one lead frame 328 will also preferably act as stabilizing portion 330b of the adjacent lead frame 328), with each stabilizing portion 330a, 330b spanning the distance between the opposite end portions 324a, 324b (which end portions 324a, 324b are preferably not subject to the stamping of Step A). The opposite end portions 324a, 324b and the stabilizing portions 330a, 330b thus generally form a rectangular frame which defines an opening 332 therebetween. The lead frame 328 also preferably includes a plurality of fingers 334 which are connected to any one of the opposite end portions 324a, 324b and the stabilizing portions 330a, 330b and which extend inwardly into the opening 332. In the formation of the Application Specific Electronics Packaging device 310, it is understood that some of the fingers 334 form high current contacts 341 and some of the fingers 334 form contact pins 342. The high current contacts 341 and the contact pins 342 may have one or more apertures 336 provided therethrough for eventual connection to the printed circuit board 200.

Figure 5:
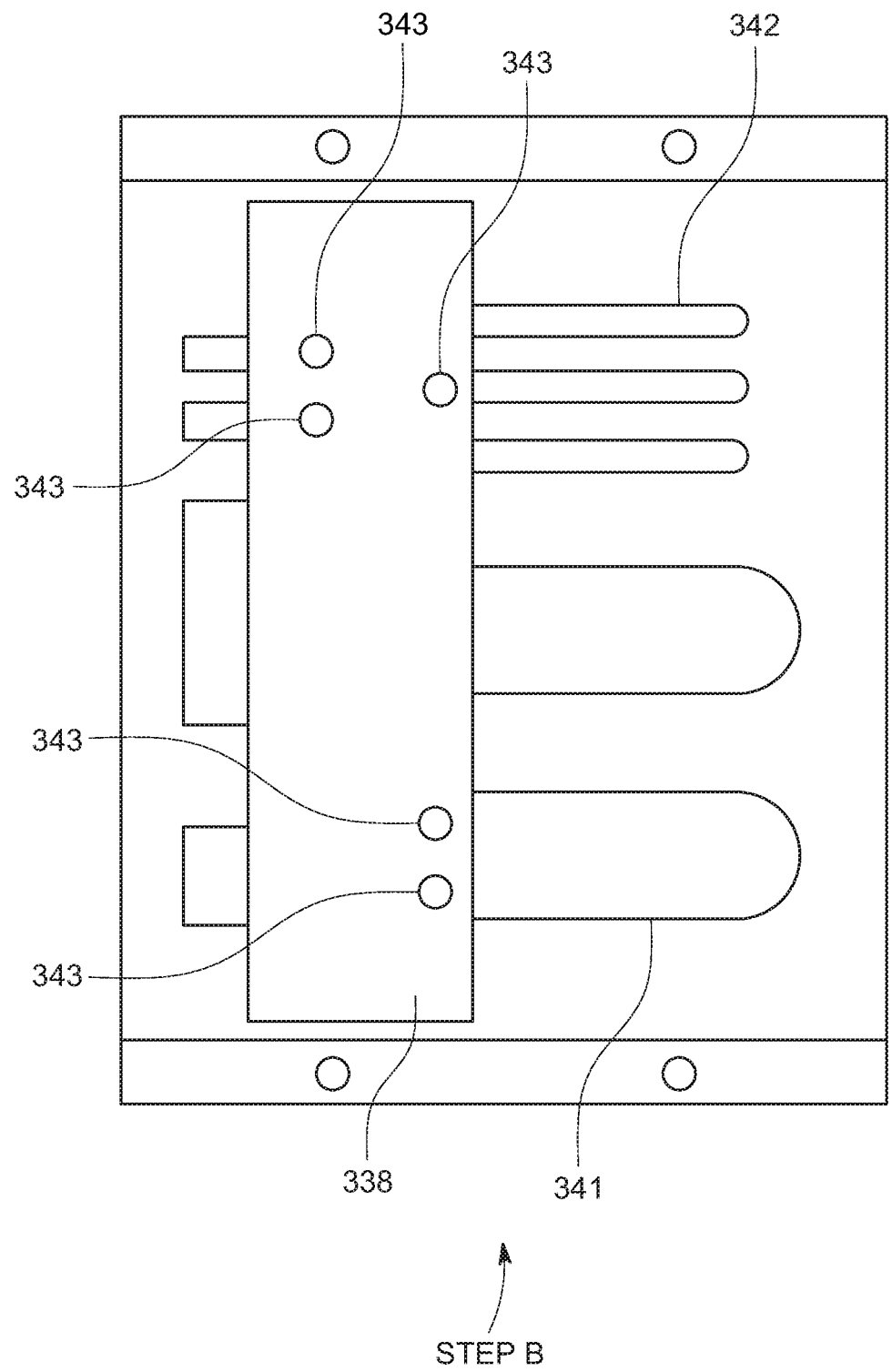

As illustrated in FIG. 4, the Application Specific Electronics Packaging manufacturing process 320 continues with Step B. In Step B, a substrate 338 is overmolded to the fingers 334 of the lead frame 328. The substrate 338 has openings 340 provided therethrough which expose different portions 341a of the high current contacts 341 for connection to the electronic components 386 as described herein, and openings 343, see FIG. 5, which expose different portions of the high current contacts 341 and the contact pins 342 for connection to the electronic components 202 on the printed circuit board 200. Only some of openings 343 are shown in FIG. 5 for illustration purposes only, the configuration of the openings 343 depends upon the connections required between the Application Specific Electronics Packaging device(s) 310 and the printed circuit board 200. While the openings 343 are shown on the opposite side of the substrate 338, the openings 343 may be through the same side of the substrate 338 as the openings 340. The substrate 338 of the Application Specific Electronics Packaging device 310 may formed of Acrylonitrile butadiene styrene (ABS), Polyphenylene sulfide (PPS), Syndiotactic Polystyrene (SPS), poly carbonate, poly carbonate blends, polypropylene, polypropylene blends. The substrate 338 of the Application Specific Electronics Packaging device 310 may also advantageously be formed with a thermally conductive liquid crystal polymer (LCP). By making the substrate 338 out of thermally conductive LCPs, the heat loads of the electronics can be significantly reduced in the Application Specific Electronics Packaging device 310.

End portions of the contact pins 342 do not have the substrate 338 overmolded thereto. The overmolding of Step B can be performed with single or two shot processes, or any other conventional molding process.

The Application Specific Electronics Packaging manufacturing process 320 continues with Step C. In Step C, patterning is performed on the substrate 338. The patterning provides for one or more patterns 344 (which may be circuit patterns) to be formed on the surface(s) of the substrate 338. The patterns 344 can be formed by any number of suitable processes, including a laser process, a plasma process (which can be a vacuum or atmospheric process), a UV process and/or a fluorination process. Depending on the process used (e.g., plasma, UV and/or fluorination), the patterning may comprise patterning (i.e., a surface treatment of) most, if not all, of the surface of the substrate 338. Thus, the patterns 344 may be formed on all or nearly all of the surface of the substrate 338.

The Application Specific Electronics Packaging manufacturing process 320 continues with Step D. In Step D, a metal layer (commonly referred to as a seed layer) is deposited on all or part of the patterns 344 (typically all when the patterns 344 are formed by a laser process, and typically a part of when the patterns 344 are formed by plasma, UV and/or fluorination processes) and connected to the substrate 338, which metal layer provides a conductive pattern or traces 346. The traces 346 also are provided along the walls of the openings 340, thus electrically connecting the traces 346 to the fingers 334, and thus to the remainder of the lead frame 328 as well. The deposition of the metal layer may be performed by any suitable process, including an electroless plating process, an ink jetprocess, a screening process, or an aerosol process. Depending on the process used, the metal to be deposited may be in any suitable form, including ink or paste. The metal to be deposited preferably has high conductivity and low binder content so as to increase its conductivity. The metal to be deposited further preferably has high chemical stability in plating baths and a viscosity that is compatible with the desired deposition process. While not illustrated, it is to be understood that portions of the fingers 334 can act as internal buss(es) which are electrically connected to the traces 346 on the surface of the substrate 338.

The Application Specific Electronics Packaging manufacturing process 320 continues with Step E. In Step E, the traces 346 are made conductive (sintered), thereby forming conductive traces 348. The sintering process can be performed by a laser or by flash heat, or any other desirable process that provides sufficient thermal energy, for instance to fuse the particles (e.g., nano or micron in size) in an ink or paste. Sintering helps ensure that the deposited metal forming the traces 346 adheres to the substrate 338 and also ensures that the deposited metal is conductive (as it often is the case that the deposited metal as applied is not sufficiently conductive to allow for a voltage potential to be applied to the traces 346). As can be appreciated, if Step D is performed with an electroless plating process, then Step E does not need to be performed, as there is no need to sinter the electroless plating.

It should further be noted that, if both Step C and Step E are performed using lasers, that a preferred process would have multiple lasers integrated into a single station/position, thereby saving space in the Application Specific Electronics Packaging manufacturing process 320 and helping to ensure that laser is properly registered. In addition, the integration of multiple lasers in a single station/position enables faster processing of the material.

As illustrated in FIG. 4, the Application Specific Electronics Packaging manufacturing process 320 continues with Step F. In Step F, the traces 346/conductive traces 348 are electroplated by applying a voltage potential to the lead frame 328 (which is electrically connected to the traces 346/conductive traces 348 via internal buss(es) and then exposing the lead frame 328, the substrate 338 and the traces 346/conductive traces 348 to an electroplating bath). The electroplating process not only electroplates the traces 346/conductive traces 348 to form electronic circuit traces 350, but electroplates the lead frame 328 to form an electroplated lead frame 354, which has electroplated fingers 356 having electroplated high current contacts 357, with portions 357a thereof that are exposed via the openings 340 of the substrate 338 and which portions thereof that are exposed via the openings 343 of the substrate 338, and electroplated contact pins 358, with portions thereof that are exposed via the openings 343 of the substrate 338. It should further be noted that the Application Specific Electronics Packaging device 310 is illustrated with two electroplated high current contacts 357, however, the Application Specific Electronics Packaging device 310 may have any number of electroplated high current contacts 357 as desired. Step F can involve a single step plating process which builds up a single layer of a single material, such as copper, or can involve a multi-step plating process which builds up multiple layers of multiple materials, such as a copper layer and a tin layer, it being understood that other suitable materials could also be used. The increased thickness allows for increased current carrying capability and, in general, the electroplating process tends to create a material that has a high conductivity, such that the performance of the resultant electronic circuit traces 350 is improved.

The connection of the traces 346 to the internal buss(es) enables electroplating of all metals, including copper, nickel, gold, silver, tin, lead, palladium, and other materials. The process of forming traces 346 which are connected to the internal buss(es) and then electroplating enables faster deposition of metals than known electroless plating processes. In addition, the plating process is smoother and lower cost when implemented using reel-to reel technology as compared with more conventional batch processes.

In another embodiment, techniques such as those included in Mesoscribe technology may be used to deposit a full thickness of copper (or other conductive material) on a surface. A picosecond laser may then be used to isolate desired conductive patterns in the conductive material. Such an approach could be used in place of Step F, as described herein, or in addition to Step F, where one or more plated materials are desired.

Steps C, D, E, and F may be used on a Syndiotactic Polystyrene (SPS) provided by XAREC and provide good retention of the electronic circuit traces 350 to the surface of the substrate 338.

The Application Specific Electronics Packaging manufacturing process 320 continues with Steps G and H after Step F, but FIG. 4 does not illustrate these steps. In Step G, a solder mask is applied which covers select portions of the electronic circuit traces 350 and all, or substantially all, of the exposed surfaces of the substrate 338. In Step H, solderpaste is stenciled onto the exposed portions of the electronic circuit traces 350 (namely those portions not covered by the solder mask 352).

Figure 6:
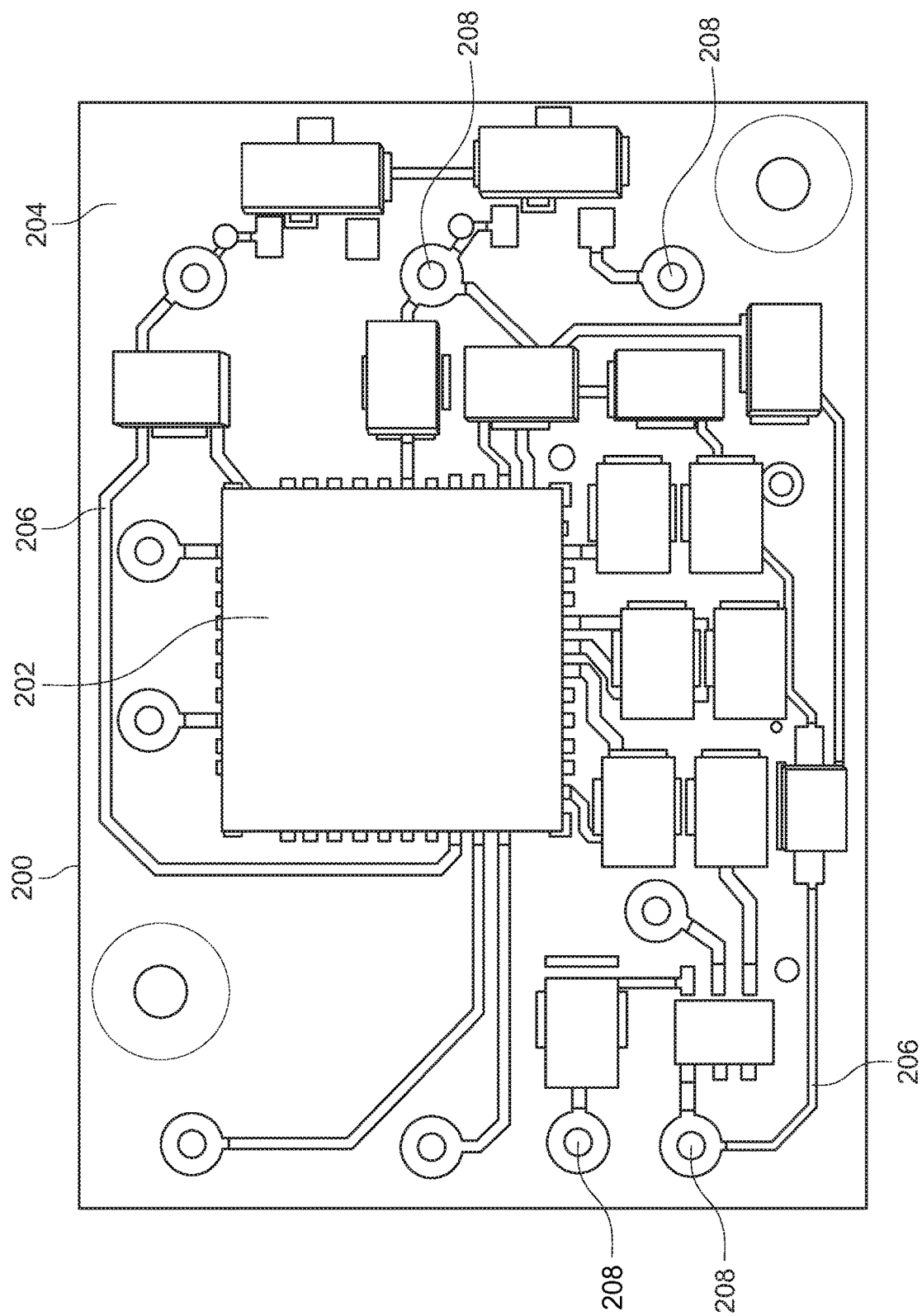
FIG. 6 depicts a plan view of an embodiment of a printed circuit board.
Figure 7:
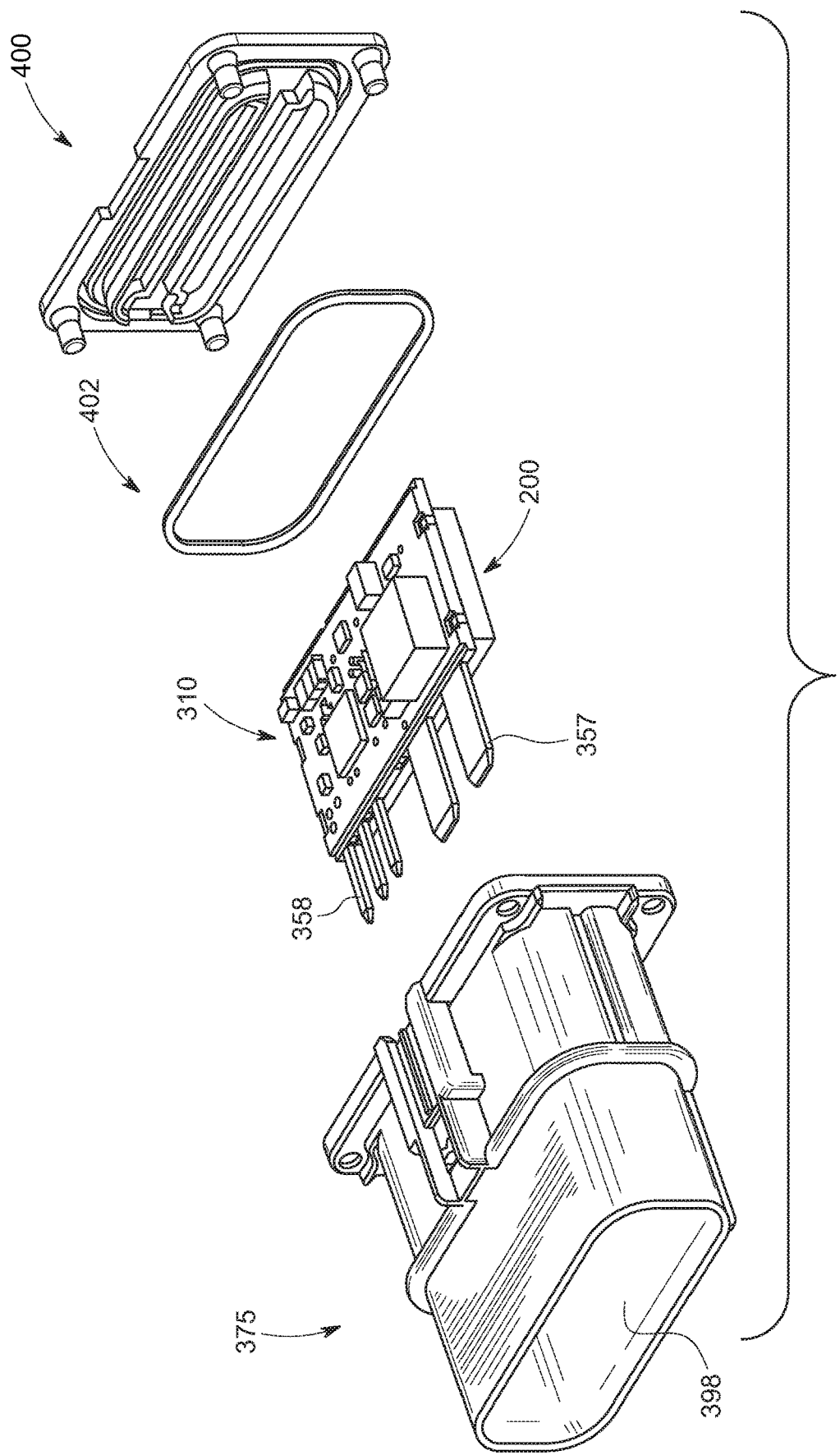
FIG. 7 depicts an exploded perspective view of an embodiment of the smart connector.

As illustrated in FIG. 6, the Application Specific Electronics Packaging manufacturing process 320 continues with Step I. In Step I, the base electrical components 386 are electrically connected to the exposed portions 357a of the electroplated high current contacts 357 and the electronic circuit traces 350, which preferably occurs via soldering. Thus, the electrical components 386 are mounted directly to the contacts 357 and the electronic circuit traces 350 such that the heat and electrical path have very low thermal resistance. As such, temperature can be controlled much better than on the printed circuit board 200. In an embodiment, the electrical component 386 includes at least a high-power FET, such as those manufactured and sold by Infineon. The FET may include reverse battery protection.

The Application Specific Electronics Packaging manufacturing process 320 continues with Step J, but FIG. 4 does not illustrate this step. In Step J, a majority of the remaining exposed electroplated fingers 356 that are connected to the "frame" of the electroplated lead frame 354 are punched/removed, leaving only a necessary amount of exposed electroplated fingers 356 still connected to the "frame" of the electroplated lead frame 354. At this point, if desired, the formed Application Specific Electronics Packaging device 310 can be electrically tested.

As illustrated in FIG. 4, the Application Specific Electronics Packaging manufacturing process 320 continues with Step K. In Step K, once the Application Specific Electronics Packaging device 310 is formed, in order for the Application Specific Electronics Packaging device 310 to be used it must be removed from the carrier web 322, in order to singulate the Application Specific Electronics Packaging device 310.

It is to be appreciated that in certain applications not all of Steps A-K will be needed. It is to be further appreciated that in certain applications the order of Steps A-K may be modified as appropriate. It should also be appreciated that while the drawings only show the Application Specific Electronics Packaging manufacturing process 320 being applied to the substrate 338, that the Application Specific Electronics Packaging manufacturing process 320 may be equally applied to internal layers.

In an embodiment, the printed circuit board 200 is conventionally formed and includes an insulating substrate 204 having circuits 206 formed thereon by a thin layer of conducting material deposited, or "printed" on the surface of the substrate 204. Individual electronic components 202 are placed on the surface of the substrate 204 and are soldered to the circuits 206. In an embodiment, the printed circuit board 200 has a plurality of contact pins 208 extending from the substrate which provide connectors to the Application Specific Electronics Packaging device(s) 310. Some of the contact pins 208 are labeled shown in FIG. 6 for illustration purposes only, the configuration of the contact pins 208 depends upon the connections required to the Application Specific Electronics Packaging device(s) 310.

Prior to, or after, the Application Specific Electronics Packaging device 310 is singulated, the printed circuit board 200 is mated with the Application Specific Electronics Packaging device(s) 310. The contact pins 208 are electrically connected to the high current contacts 341 and the contact pins 342 as necessary to complete the mating of the printed circuit board 200 with the Application Specific Electronics Packaging device(s) 310. In some embodiments, the contact pins 208 extend through the openings 343 and through the apertures 336 for connection to the high current contacts 341 and the contact pins 342 in a press-fit manner. In some embodiments, the contact pins 208 are surface mounted to the high current contacts 341 and the contact pins 342 via the openings 343, for example by soldering. Thereafter, the mated printed circuit board 200 and Application Specific Electronics Packaging device(s) 310 are assembled/connected into the housing 375 to form the smart connector 360. In an embodiment, multiple housings may be provided with the printed circuit board 200 in one housing, and each Application Specific Electronics Packaging device 310 in its own housing. In an embodiment, multiple housings may be provided with the printed circuit board 200 and one or more of the Application Specific Electronics Packaging devices 310 in one housing, and other Application Specific Electronics Packaging devices 310 in their own housings.

The substrate 338 has a forward edge 390, a rearward edge 392, and first and second side edges 394, 396. The housing 375 may include a first inner portion (not shown) into which the mated printed circuit board 200 and Application Specific Electronics Packaging device(s) 310 is inserted and housed. The side edges 394, 396 of the Application Specific Electronics Packaging device 310 may be inserted into track portions (not shown) defined by the housing 375 until the forward edge 390 of the Application Specific Electronics Packaging device(s) 310 abuts against an internal wall (not shown) of the housing 375. The internal wall separates the housing 375 into a first inner portion (not shown) and a second inner portion 398 and has a plurality of apertures (not shown) extending therethrough which allow the electroplated high current contacts 357 and the electroplated contact pins 358 to extend into the second inner portion 398. A cover 400 can be secured to the housing 375 via known means to close off the first inner portion and, in essence, encapsulate the Application Specific Electronics Packaging device(s) 310/printed circuit board 200 therein. The cover 400, as well as the internal wall, may be configured to have track portions to receive the side edges 394, 396 of the Application Specific Electronics Packaging device(s) 310 to stabilize the Application Specific Electronics Packaging device(s) 310/printed circuit board 200 in position within the housing 375. A gasket 402 may be provided between the cover 400 and the housing 375 to seal off the Application Specific Electronics Packaging device(s) 310/printed circuit board 200 from outside elements.

Figure 8:
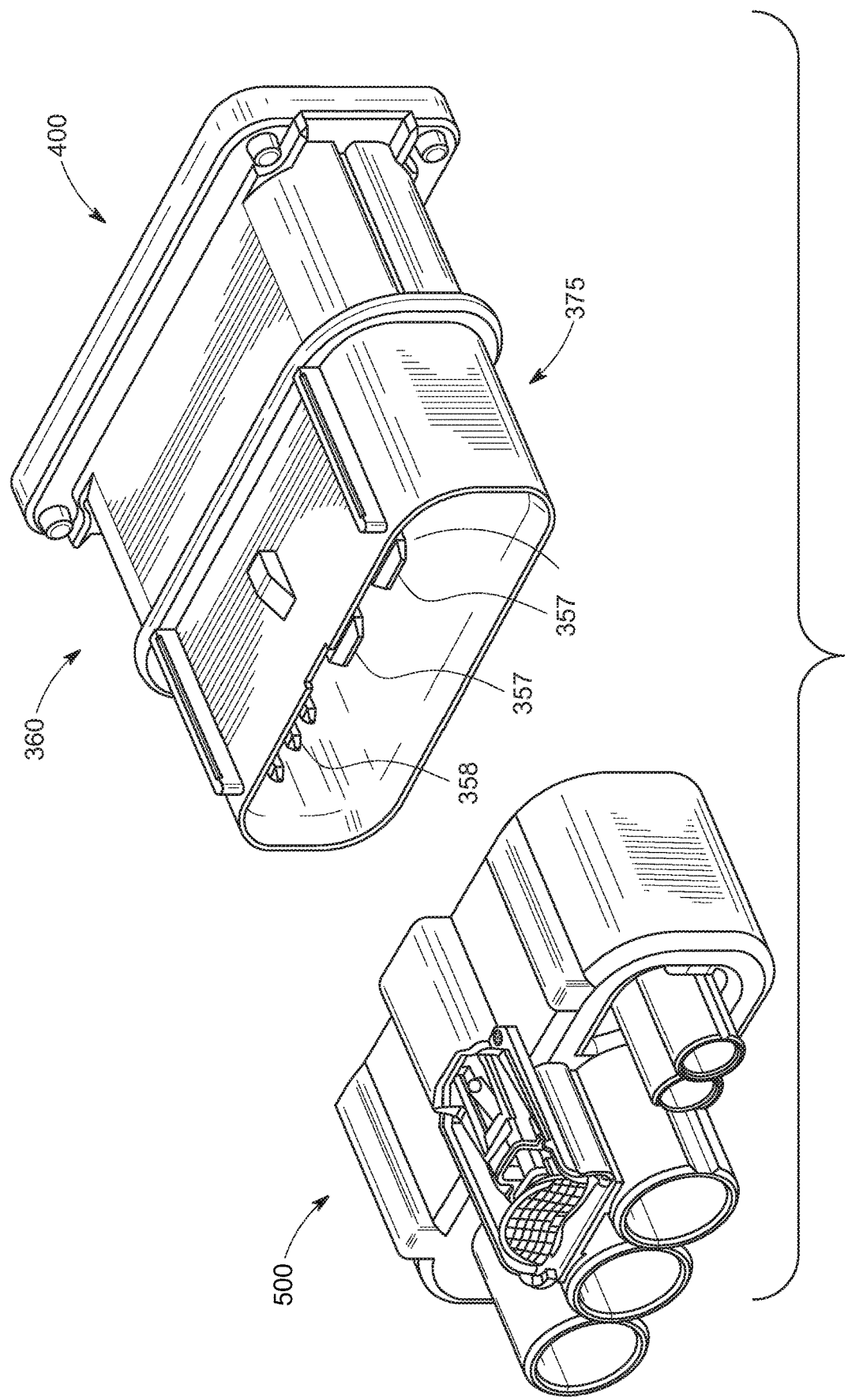
FIG. 8 depicts a perspective view of a connector assembly, in an unmated arrangement, including the smart connector and a mating connector.

With the smart connector 360 formed, it can be connected to a mating connector 500, see FIG. 8, which is configured to be electrically connected to the smart connector 360 via the electroplated high current contacts 357 and the electroplated contact pins 358, thereby providing a connector assembly. The connector assembly, either via the smart connector 360 or via the mating connector 500 (or both, if desired), can be mounted within a vehicle, typically to a panel, in a number of known ways.

This forms a small and light weight smart connector 360.

The printed circuit board 200 may be directly mated to the side of the substrate 338 which does not have the electrical components 386 thereon. The side of the substrate 338 which does not have the electrical components 386 thereon may be planar and ideally suited for connection to the printed circuit board 200. The printed circuit board 200 may have outer edges which define a perimeter which is smaller than the perimeter defined by edges 390, 392, 394, 396 of the substrate 338, such that the printed circuit board 200 does not extend beyond edges 390, 392, 394, 396. This provides a compact assembly. Other orientations are possible. For example, the printed circuit board 200 may be mounted on the same surface as the electrical components 386 and extend outwardly from one or more of the edges 390, 392, 394, 396, or for example, the printed circuit board 200 may be above the electrical components 386 and electrically connected to the Application Specific Electronics Packaging device(s) 310.

The Application Specific Electronics Packaging device 310 and mated printed circuit board 200 can be used to form a smart battery switch which can be either used to carry 400 Amps or provide a secondary redundant protection due to primary switch malfunction. The Application Specific Electronics Packaging device 310 and mated printed circuit board 200 can be used to form a smart battery switch that is capable of switching 200 Amps. Each battery switch may have reverse-battery protection.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All processes described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context. As can be appreciated from the various embodiments depicted herein, different features of different embodiments depicted herein can be combined together to form additional combinations. As a result, the embodiments depicted herein are particularly suitable to provide a wide range of configurations that were not all depicted individually so as to avoid repetitiveness and unnecessary duplication.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. A method of forming a smart connector comprising:
   forming a lead frame defining an opening and having a plurality of fingers which extend into the opening;
   overmolding a substrate onto the fingers, the substrate having a plurality of openings provided therethrough thereby forming exposed portions of the fingers;
   electroplating traces on the substrate which are electrically coupled to the exposed portions;
   mounting at least one electrical component on the substrate and electrically connecting the at least one electrical component to the traces;
   separating the fingers from a remainder of the lead frame to form an Application Specific Electronics Packaging device; and
   electrically attaching a separate printed circuit board to the exposed portion of some of the fingers, the separate printed circuit board having electrical components thereon which are configured to control the functionality of the at least one electrical component of the Application Specific Electronics Packaging device or are configured to modify properties of the at least one electrical component of the Application Specific Electronics Packaging device.

2. The method as defined in claim 1, further comprising:
   mounting the Application Specific Electronics Packaging device and the printed circuit board in a housing.

* * * * *